(12) United States Patent
Yotsuya et al.

(10) Patent No.: US 7,771,789 B2
(45) Date of Patent: Aug. 10, 2010

(54) METHOD OF FORMING MASK AND MASK

(75) Inventors: Shinichi Yotsuya, Chino (JP); Hiroshi Koeda, Suwa (JP); Takayuki Kuwahara, Chino (JP); Tadayoshi Ikehara, Suwa (JP)

(73) Assignee: Seiko Epson Corporation (JP)

( * ) Notice: Subject to any disclaimer, the term of this patent is extended or adjusted under 35 U.S.C. 154(b) by 1110 days.

(21) Appl. No.: 11/325,649

(22) Filed: Jan. 4, 2006

(65) Prior Publication Data

US 2006/0148114 A1   Jul. 6, 2006

(30) Foreign Application Priority Data

Jan. 6, 2005   (JP) .............................. 2005-001153

(51) Int. Cl.
| | |
|---|---|
| C23C 16/00 | (2006.01) |
| B05D 5/12 | (2006.01) |
| B05D 1/32 | (2006.01) |
| B05D 3/00 | (2006.01) |
| B41N 1/24 | (2006.01) |
| B29C 35/08 | (2006.01) |
| H01F 1/00 | (2006.01) |
| H05B 6/00 | (2006.01) |

(52) U.S. Cl. .................... 427/248.1; 427/272; 427/282; 427/294; 427/300; 427/598; 427/127; 427/143

(58) Field of Classification Search ........................ None
See application file for complete search history.

(56) References Cited

U.S. PATENT DOCUMENTS

| | | | | |
|---|---|---|---|---|
| 2001/0009689 | A1* | 7/2001 | Himeshima et al. | ............ 427/64 |
| 2003/0054646 | A1* | 3/2003 | Yotsuya | ....................... 438/689 |
| 2004/0142108 | A1 | 7/2004 | Atobe et al. | |
| 2004/0232109 | A1 | 11/2004 | Yoshinaga | |

FOREIGN PATENT DOCUMENTS

| | | |
|---|---|---|
| JP | 2001-3155 | 1/2001 |
| JP | 2001-237073 | 8/2001 |
| JP | 2002-047560 | 2/2002 |
| JP | 2002-075638 | 3/2002 |
| JP | 2004-183044 | 7/2004 |
| JP | 2004-335487 | 11/2004 |
| JP | 2004-346356 | 12/2004 |
| KR | 2003-002622 | 3/2003 |

OTHER PUBLICATIONS

Communication from Korean Patent Office regarding counterpart application.

* cited by examiner

*Primary Examiner*—Timothy Meeks
*Assistant Examiner*—Kelly M Gambetta
(74) *Attorney, Agent, or Firm*—Harness, Dickey & Pierce, P.L.C.

(57) ABSTRACT

A method of forming a mask, in which a film pattern is formed on a substrate by using a mask, includes sequentially arranging the mask, the substrate and a first member having a flat surface contacting with the substrate in this order from a supply source of film forming material; and attracting the mask and the first member by means of a magnetic force.

9 Claims, 18 Drawing Sheets

METHOD OF FORMING MASK AND MASK

BACKGROUND

1. Technical Field

The present invention relates to a method of forming a mask and a mask, and in particular, to a method of forming a film adapted to film formation by deposition and a mask.

2. Related Art

In manufacturing a large-sized full color organic electroluminescent (EL) panel used in a TV display, a highly precise deposition mask is needed and the deposition mask must be precisely aligned with a substrate to be filmed so as to be deposited. Conventionally, a metal mask made of very thin galvanoplastics has been widely used to manufacture the full color organic EL panel. Due to the metal mask having high flexibility, the metal mask must be bonded to a mask holding frame with tension so as to be used in the panel. However, it is difficult to manufacture a highly precise mask since dimensions of the mask become too large due to plastic deformation occurring when the tension is applied. Thus, a producible size of the full color organic EL panel using the metal mask has a limitation of 20 inches or so, which is realized in the present condition.

In order to overcome such a limitation, a technique of using a silicon wafer having very high substrate strength and excellent flatness has been studied. In addition, since the silicon substrate itself has no large substrate, a technique of precisely aligning the silicon mask with a large frame to obtain a deposition mask corresponding to the large substrate has been proposed (for example, see JP-A-2001-237073).

However, since the mask becomes heavier as it becomes larger in size, it may warp due to its own weight. As a result, even though the substrate is aligned with the mask, a gap between the substrate and the mask may occur due to the bend, which may result in an incorrect mask patterning.

SUMMARY

An advantage of some aspects of the invention is that it provides a method of forming a mask, which is capable of preventing or suppressing a mask from being bent and facilitating a film forming process having high density deposition, and a mask.

According to an aspect of the invention, a method of forming a mask, in which a film pattern is formed on a substrate by using a mask, includes sequentially arranging the mask, the substrate and a first member having a flat surface contacting with the substrate in this order from a supply source of film forming material; and adhering the mask to the first member by using a magnetic force. Here, it is not essential to provide members other than the first member.

According to the above-described method of forming a film, since the mask is attracted from the first member by the magnetic force, it is possible to prevent or suppress the substrate and the mask from being bent or curved. As a result, particularly when the substrate is a large-sized substrate of more than 1 m×1 m, it is possible to form a film pattern having very high density.

According to the aspect of the invention, the mask may include a base substrate having openings and a monocrystalline silicon substrate formed on the base substrate and having opening patterns. In this case, the base substrate is aligned with the monocrystalline silicon substrate such that the opening patterns are accommodated in the openings, and non-opening portions of the base substrate are provided with a permanent magnet or a ferromagnetic substance. In this manner, by providing the permanent magnet or a ferromagnetic substance in the non-opening portions of the base substrate, the mask can be attracted from the first member by the magnetic force. In addition, in this case, it is also preferable to provide a permanent magnet or a ferromagnetic substance in the first member.

According to the above-described method of forming a film, in particular, when a film is formed such that the supply source is arranged below the substrate, the following aspect can be considered. The mask is disposed on a second member, the mask is closely adhered to the substrate after aligning the substrate on the mask with a predetermined gap therebetween, and the first member is arranged on the substrate, and the mask is adhered to the first member by a magnet, and then the film forming material is supplied from the supply source under a condition where the mask, the substrate, the first member and the magnet are integrally formed.

According to the above-described method of forming a film, in particular, when a film is formed such that the supply source is arranged above the substrate, the following aspect can be considered. The substrate is disposed on the first member including an electromagnet, the mask is closely adhered to the substrate after aligning the mask on the substrate with a predetermined gap therebetween, and the mask is attracted by actuating the electromagnet included in the first member, and then the film forming material is supplied from the supply source under a condition where the mask, the substrate, the first member are integrally formed.

In either the above-mentioned method of forming a film downward or upward, it is possible to form a film pattern simply and having a high density.

According to the aspect of the invention, the alignment of the substrate with the mask may be performed while the substrate is held by an electrostatic force or vacuum. Accordingly, the substrate can be properly maintained and it is possible to minutely move the substrate to align the substrate with the mask.

According to another aspect of the invention, a mask includes a base substrate having openings and a monocrystalline silicon substrate formed on the base substrate and having opening patterns. The base substrate is aligned with the monocrystalline silicon substrate such that the opening patterns are accommodated in the openings, and non-opening portions of the base substrate are provided with a permanent magnet or a ferromagnetic substance. With the above mask, even when the substrate is a large-sized substrate of more than 1 m×1 m, it is possible to form a film pattern having very high density.

The method of forming a film and the mask according to the aspects of the invention may be employed, for example, in manufacturing organic electroluminescent devices. Specifically, when the method of forming a film uses the mask in forming an organic electroluminescent layer in a pattern for each pixel, it is possible to enhance reliability of the organic electroluminescent devices. Also, the method of forming a film and the mask according to the aspects of the invention may be applied to the formation of circuit wires of liquid crystal monitors, for example, in addition to the organic electroluminescent devices.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
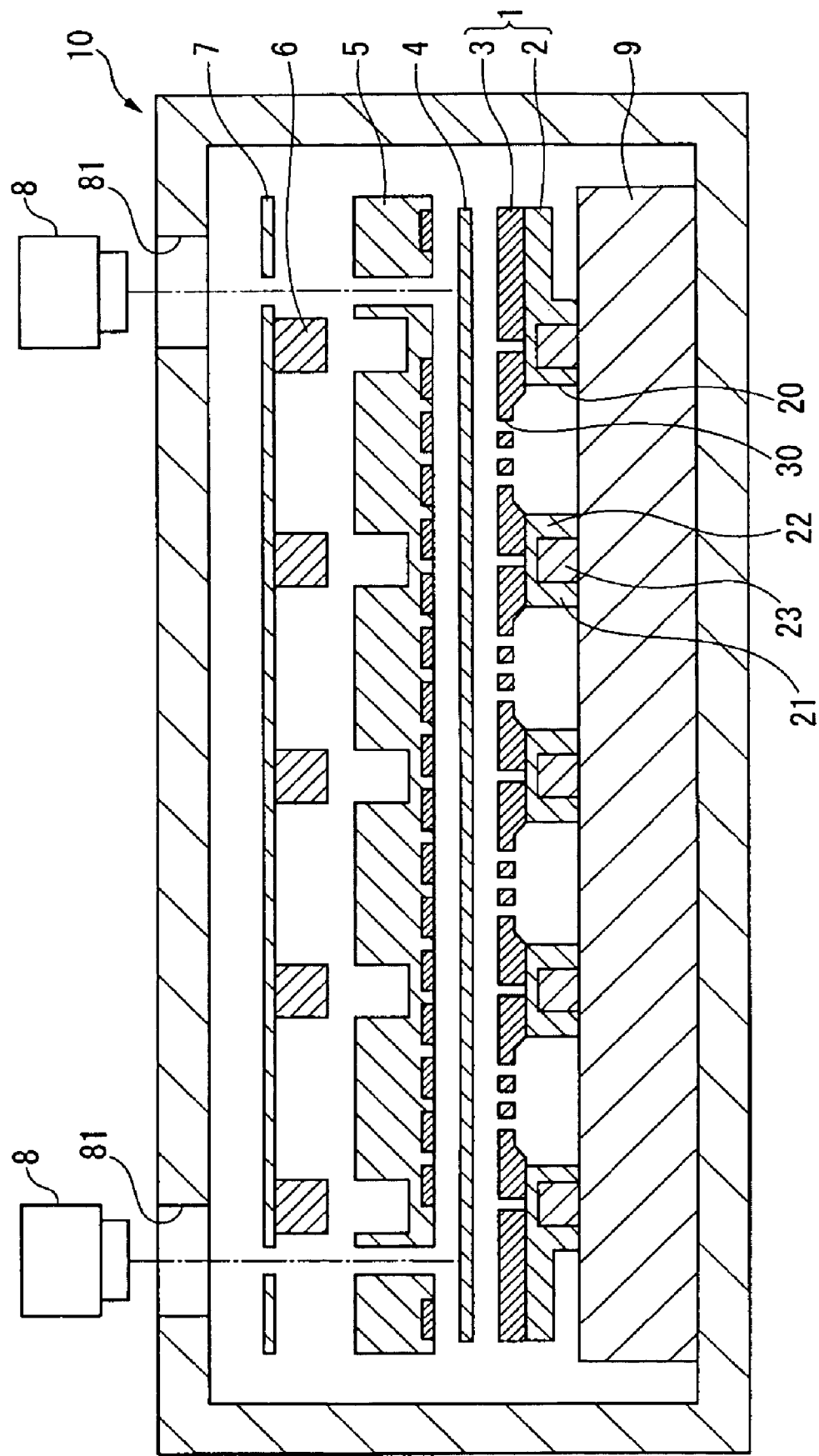
FIG. 1 is a schematic diagram illustrating configuration of a chamber used in a deposition method according to one embodiment of the invention.

Hereinafter, a method of forming a film and a mask of the invention will be described with reference to FIGS. 1 to 10 in which a deposition method and a deposition mask according to one embodiment of the invention are shown. FIG. 1 is a schematic diagram illustrating an alignment chamber used in a deposition method according to one embodiment of the invention, and FIGS. 2 to 10 are schematic diagrams illustrating processes of the deposition method according to one embodiment. A chamber 10 shown in FIG. 1 is a chamber 10 in which a mask 1 for deposition is aligned with a substrate 4 to be deposited. A deposition process is performed in a separate chamber 11 (see FIG. 6). The deposition process performed in this embodiment is to eject deposition material upward from a source of deposition 12 (see FIG. 6) and form the ejected deposition material in the form of a film in a predetermined pattern on the substrate 4 above the source of deposition 12 (see FIG. 6).

The mask 1 includes a base substrate 2 having openings 20 and a monocrystalline silicon substrate 3 bonded to the base substrate 2 and having opening patterns 30 corresponding to the film forming patterns. The monocrystalline silicon substrate 3 is precisely positioned such that the opening patterns 30 are accommodated in the openings 20 of the base substrate 2. The base substrate 2 is made of glass, and non-opening portions (beam portions) 21 of the base substrate 2 are formed with holes 22 in which pieces of iron 23 (a permanent magnet or a ferromagnetic substance) are embedded.

The mask 1 is loaded on a lower plate (second member) 9 movable in X-Y-θ directions. The lower plate 9 is a non-magnetic surface plate (a surface contacting with the mask 1) having a flatness in the range of 10 μm to 100 μm (for example, 30 μm).

In addition, the substrate 4 is held by a chuck (first member) 5 installed at a side opposite to a surface of the substrate 4 on which deposition substance is deposited (i.e., a back side of the substrate 4). The chuck 5 used in this embodiment has a mechanism for chucking the substrate 4 by using electrostatic force. In addition, a surface of the chuck 5 contacting with the substrate 4 is subject to a polishing treatment so as to become flat having a flatness in the range of 10 μm to 100 μm (for example, 30 μm).

In addition, at a back side of the chuck 5 is arranged a magnetic plate 7 on which permanent magnets 6 are attached. A magnetic force (absorption force) produced between the permanent magnets 6 and the pieces of iron 23 contained in the base substrate 2 of the mask 1 can be controlled by sliding the magnetic plate 7 vertically. In addition, at least two CCD cameras 8 are installed above the chamber 10. A process of aligning the mask 1 with the substrate 4 can be performed using the CCD cameras 8 through inspection windows 81 formed in the chamber 10.

Next, a sequence of deposition according to this embodiment will be described.

Figure 2:
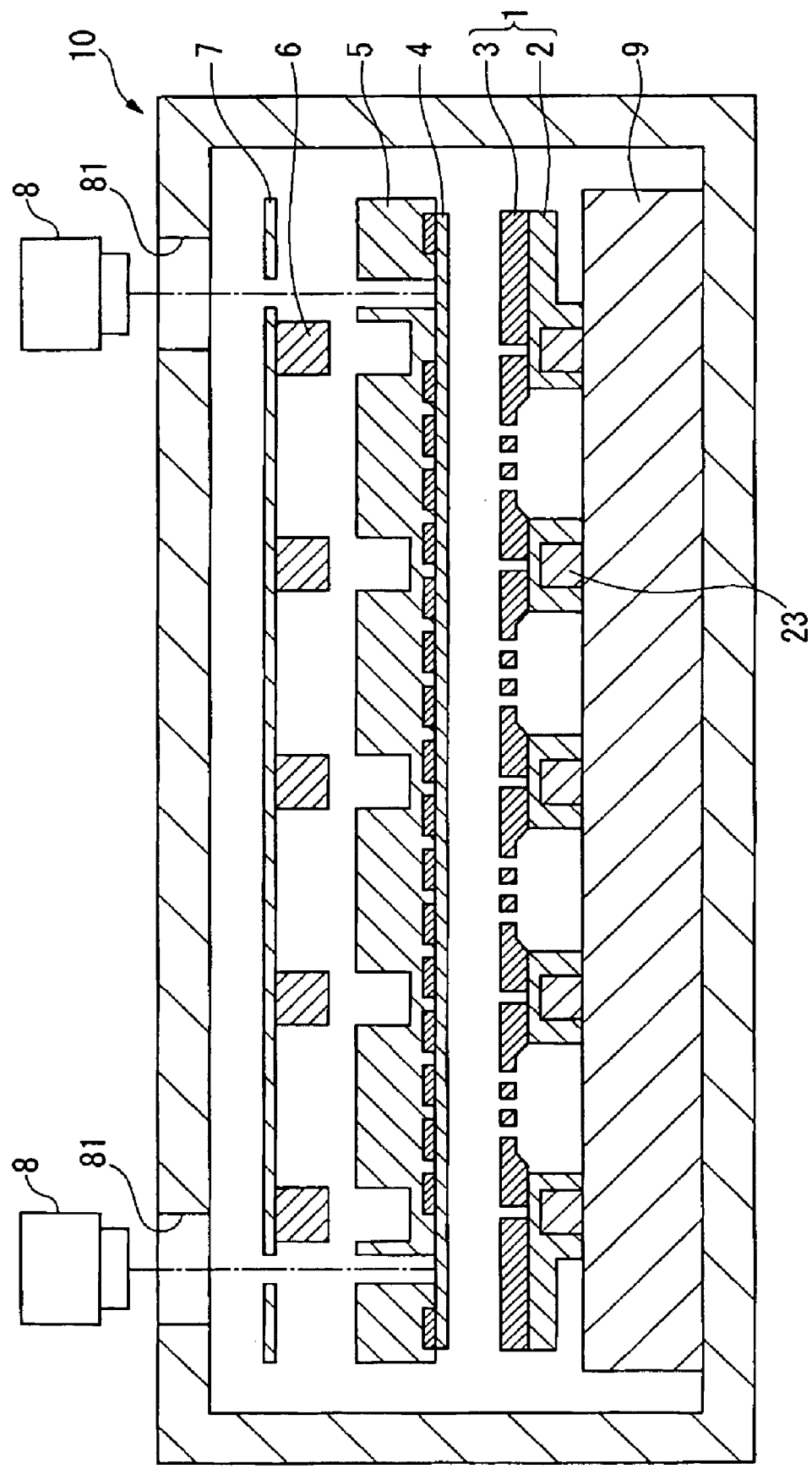
FIG. 2 is a schematic diagram illustrating one process of the deposition method according to one embodiment.
Figure 3:
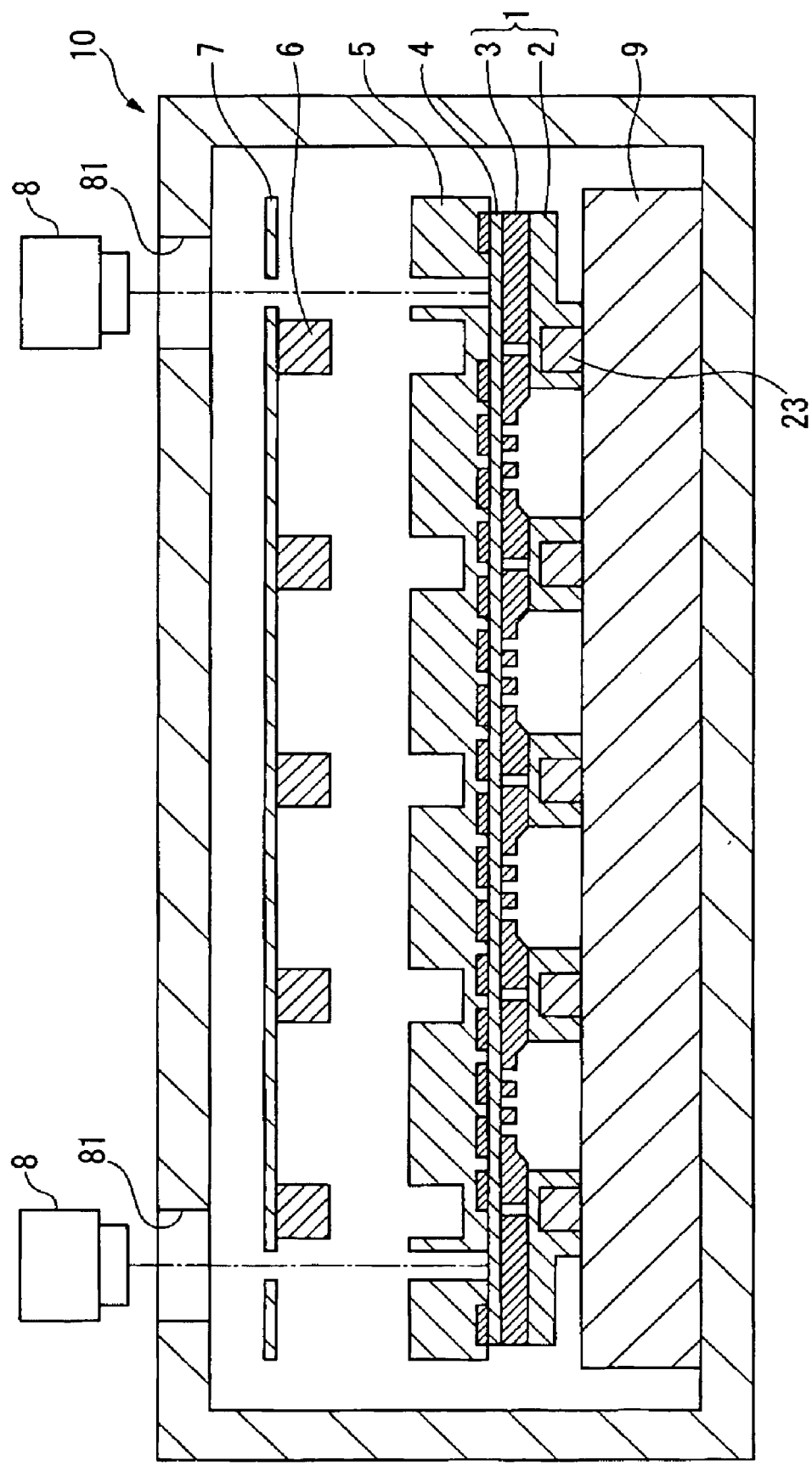
FIG. 3 is a schematic diagram illustrating one process of the deposition method according to one embodiment, subsequent to the process of FIG. 2.

First, the substrate 4 is absorbed and held by the chuck 5 in the chamber 10, as shown in FIG. 2. With such absorption and holding maintained, the chuck 5 is lowered down to a position at which both an alignment mark (not shown) inscribed on the mask 1 and an alignment mark (not shown) inscribed on the substrate 4 are apparently seen at a time by the CCD cameras 8 installed above the chamber 10, as shown in FIG. 3. With the chuck 5 lowered so, after the position of the lower plate 9 is properly adjusted in the X-Y-θ directions so as to align the substrate 4 with the mask 1, the substrate 4 is reliably closely adhered to the mask 1.

Figure 4:
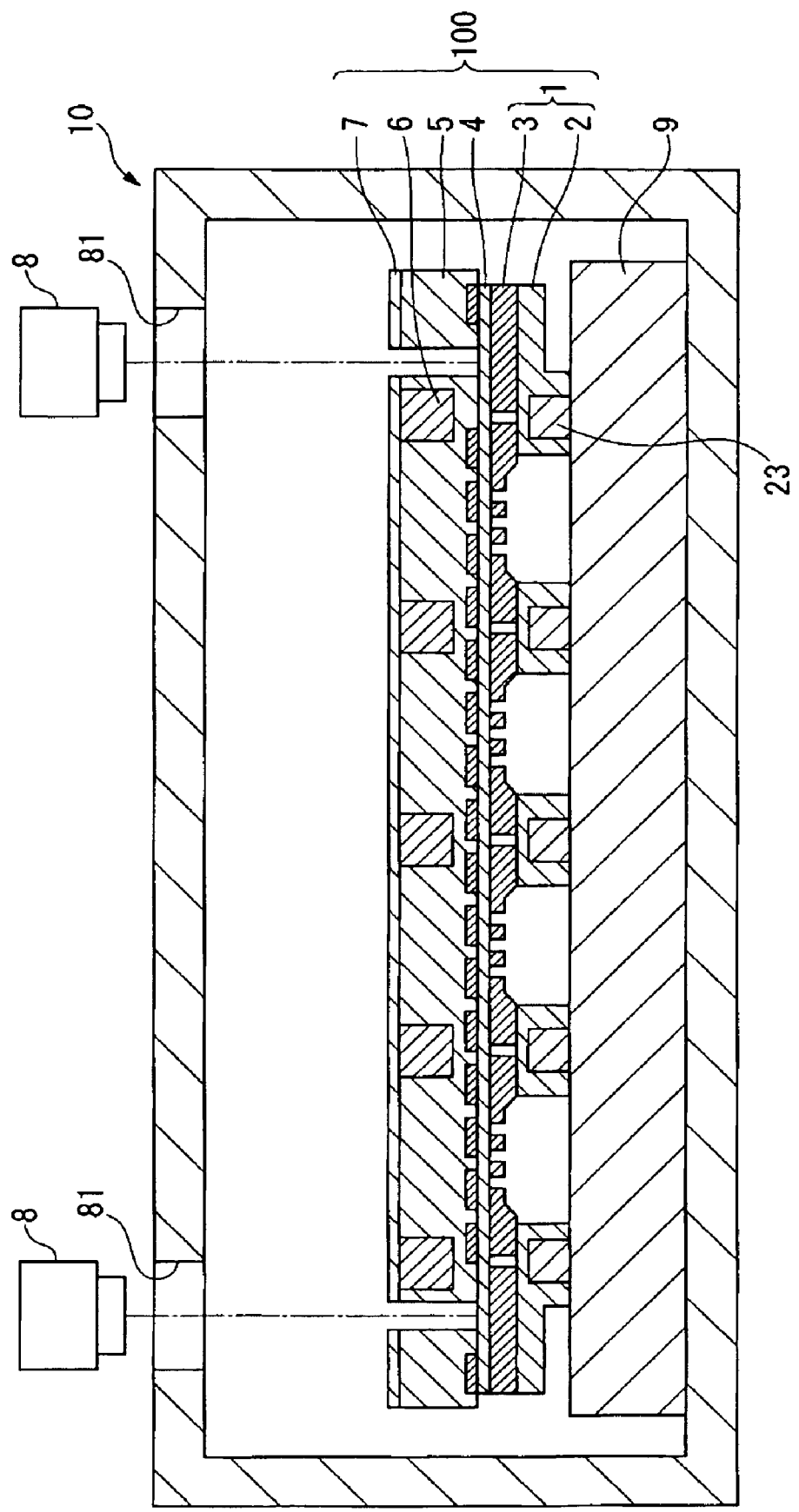
FIG. 4 is a schematic diagram illustrating one process of the deposition method according to one embodiment, subsequent to the process of FIG. 3.

Subsequently, four corners of each of the substrate 4, the chuck 5 and the mask 1 are clamped so as to fix these members, and the chuck 5 is inactivated, and then, the magnetic plate 7 on which the permanent magnets 6 are attached is lowered, as shown in FIG. 4. Accordingly, a great absorption force is produced between the pieces of iron contained in the mask 1 and the permanent magnets 6 such that the mask adheres to the chuck 5.

Figure 5:
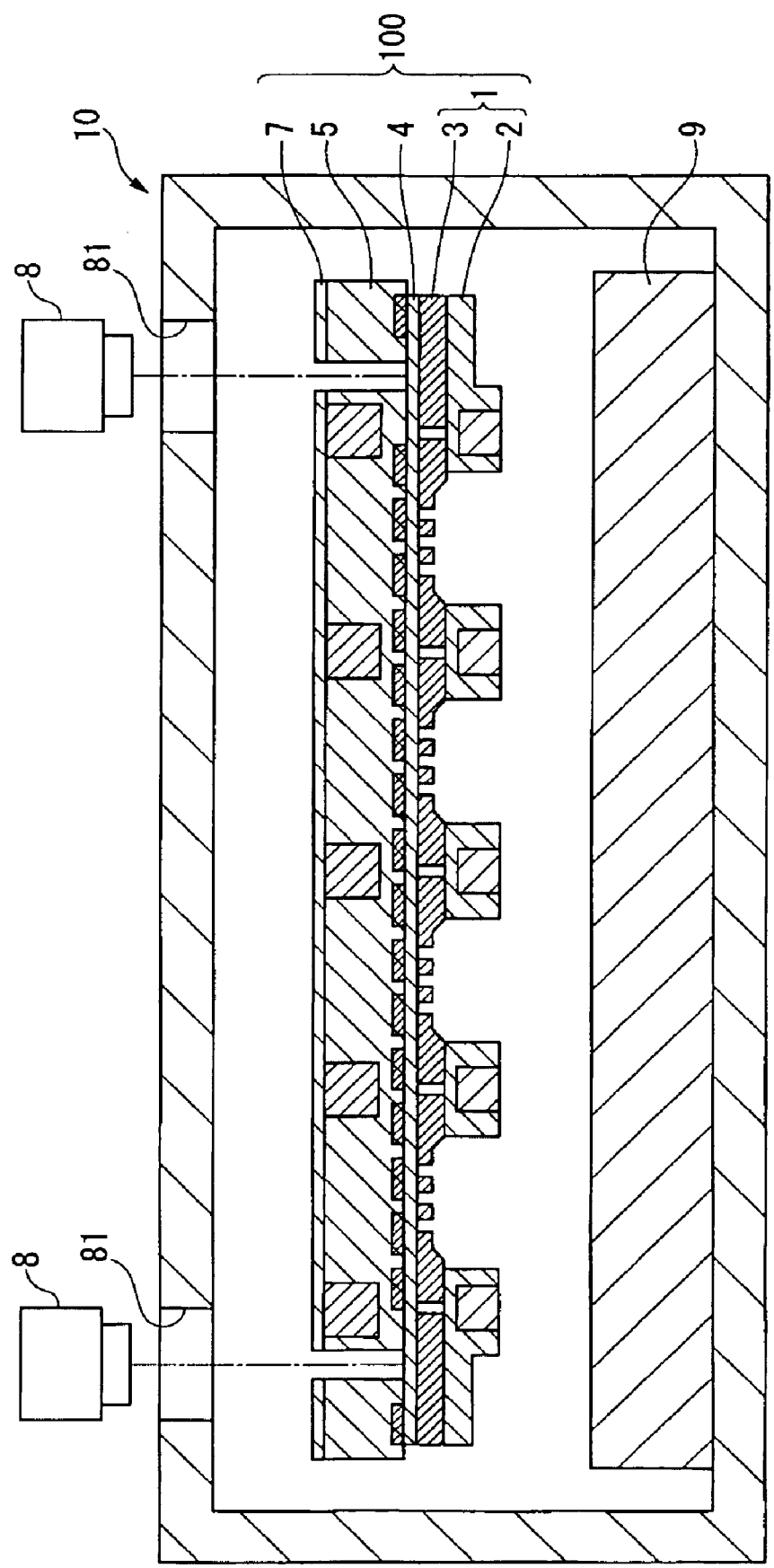
FIG. 5 is a schematic diagram illustrating one process of the deposition method according to one embodiment, subsequent to the process of FIG. 4.
Figure 6:
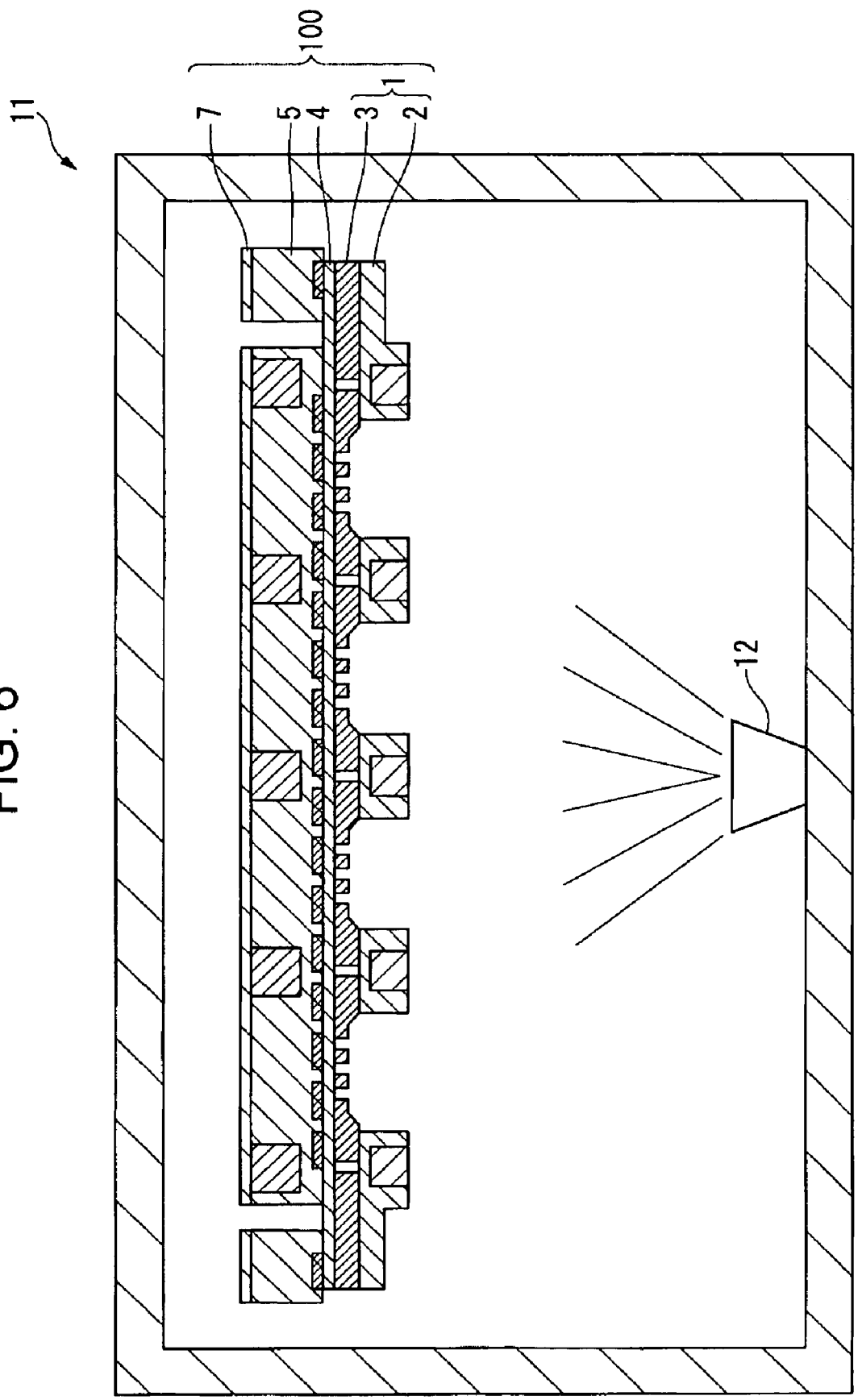
FIG. 6 is a schematic diagram illustrating one process of the deposition method according to one embodiment, subsequent to the process of FIG. 5.

Next, a unit 100 composed of the mask 1, the substrate 4, the chuck 5 and the magnetic plate 7, which are integrally formed, is separated from the lower plate 9, as shown in FIG. 5, and carried into a deposition chamber 11 as shown in FIG. 6.

A deposition process is performed in the deposition chamber 11, with the unit 100 arranged above the source of deposition 12. Since the mask 1 is adhered to the chuck 5 by the magnetic force, it will not be bent by its weight and is reliably closely adhered to the substrate 4 in a flat state. Accordingly, very high density mask deposition can be attained.

Figure 7:
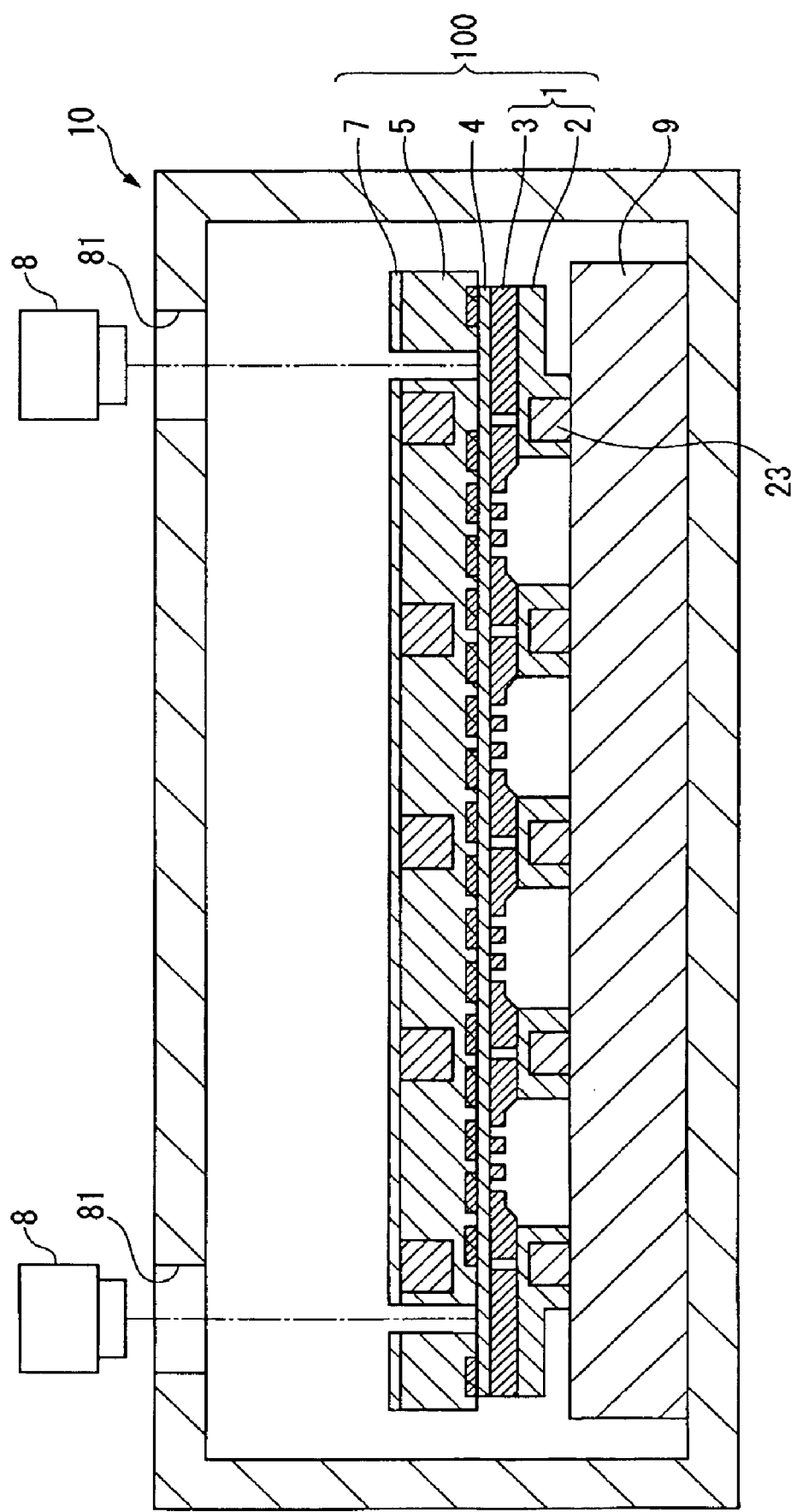
FIG. 7 is a schematic diagram illustrating one process of the deposition method according to one embodiment, subsequent to the process of FIG. 6.
Figure 8:
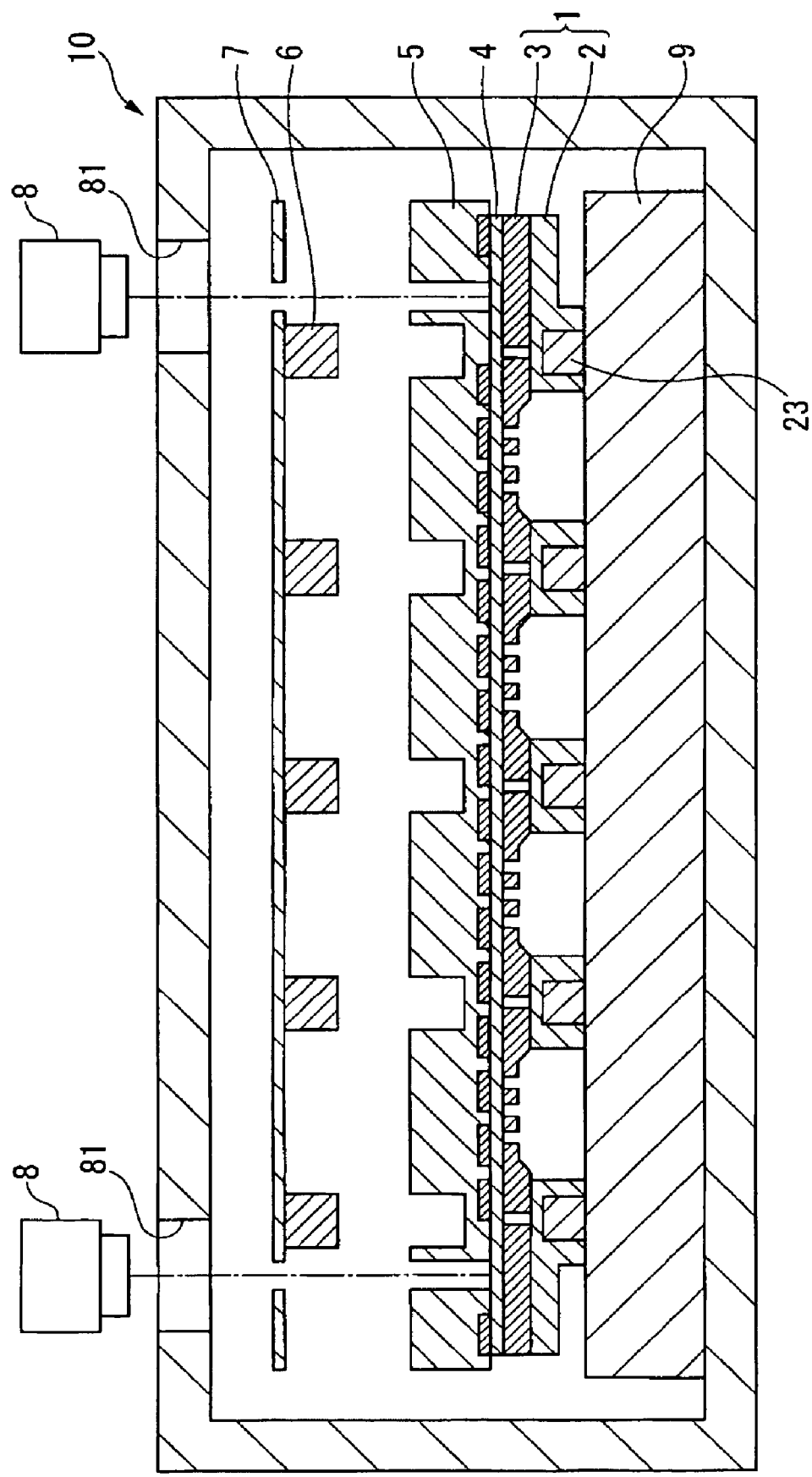
FIG. 8 is a schematic diagram illustrating one process of the deposition method according to one embodiment, subsequent to the process of FIG. 7.

After the deposition process within the deposition chamber 11 is completed, the unit 100 is conveyed again from the deposition chamber 11 to the chamber 10. After being conveyed again, the unit 100 is loaded on the lower plate 9, as shown in FIG. 7. Then, the magnetic plate 7 is raised to remove the magnetic force and the chuck 5 is actuated to produce an electrostatic absorption force.

Figure 9:
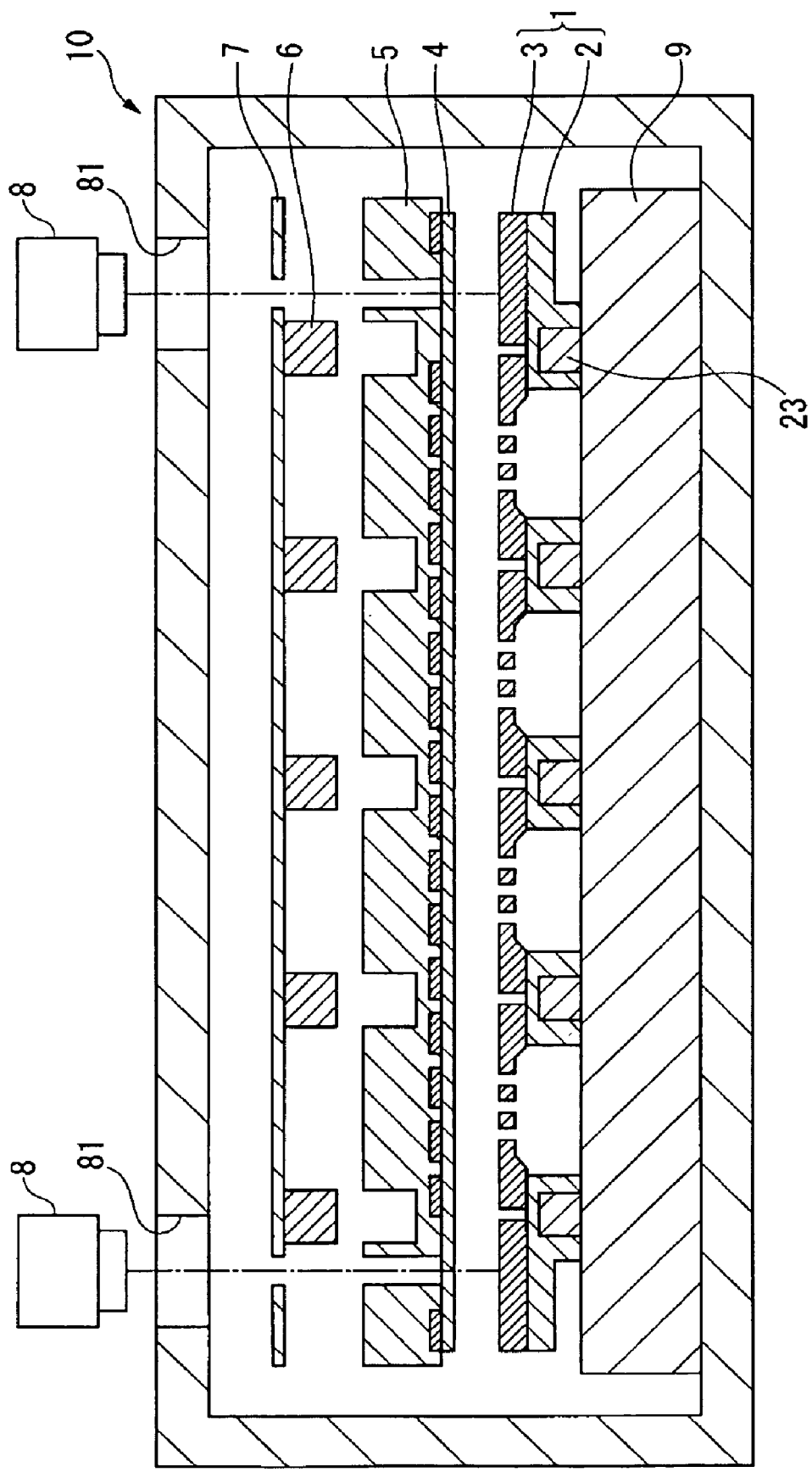
FIG. 9 is a schematic diagram illustrating one process of the deposition method according to one embodiment, subsequent to the process of FIG. 8.
Figure 10:
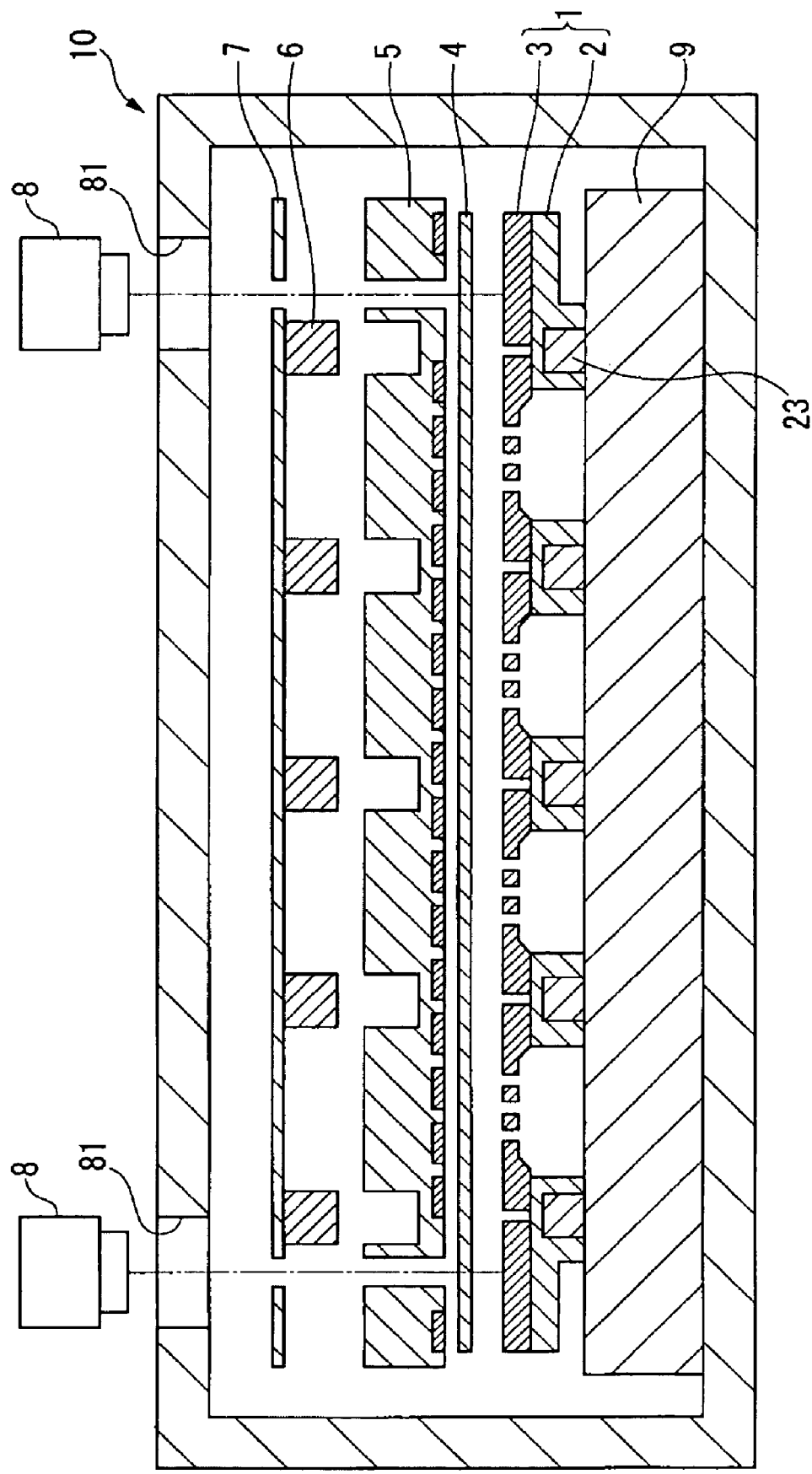
FIG. 10 is a schematic diagram illustrating one process of the deposition method according to one embodiment, subsequent to the process of FIG. 9.

Next, the chuck 5 absorbing the substrate 4 is raised, as shown in FIG. 9, and then, the electrostatic absorption force of the chuck 5 is released, as shown in FIG. 10. Finally, the substrate 4 is held by a conveying arm (not shown) and taken out of the chamber 10 to complete the deposition process.

According to the above-described deposition process, since the mask 1, the substrate 4, and the chuck 5 whose flat surface contacts with the substrate 4 are sequentially arranged from the source of deposition 12 and the deposition process is performed while the mask 1 adheres to the chuck 5 by using the magnetic force, it is possible to prevent or suppress the substrate 4 and the mask 1 from being bent or curved, particularly when the substrate 4 is large. As a result, it is possible to facilitate very high density mask deposition for a large-scaled substrate.

Second Embodiment

Figure 11:
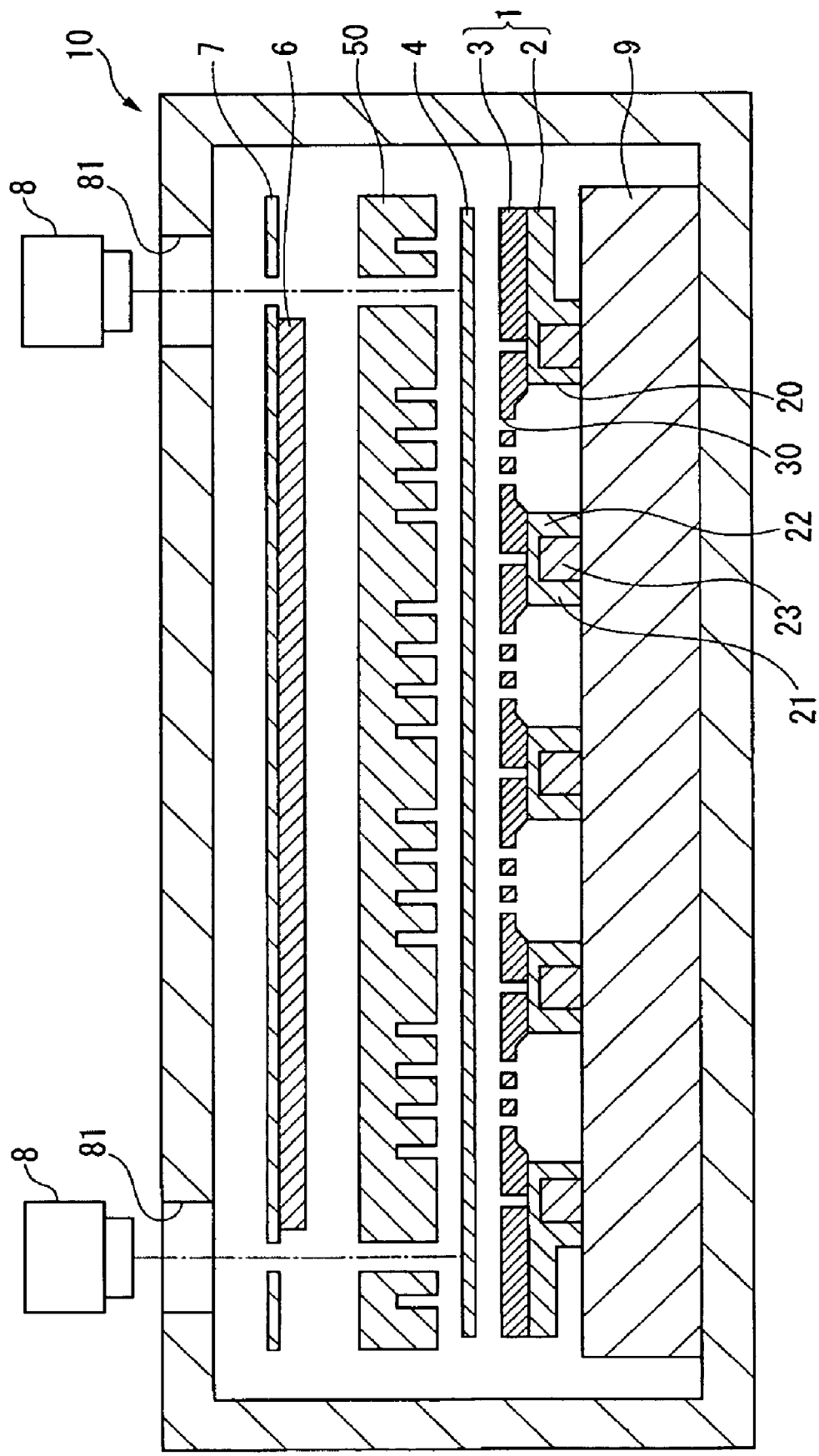
FIG. 11 is a schematic diagram illustrating configuration of a chamber used in a deposition method according to another embodiment of the invention.

Next, a method of forming a film and a mask according to the invention will be described with reference to FIGS. 11 to 17, in which a deposition method and a deposition mask according to another embodiment of the invention are shown. FIG. 11 is a schematic diagram illustrating an alignment chamber used in a deposition method according to another embodiment of the invention, and FIGS. 12 to 17 are schematic diagrams illustrating processes of the deposition method according to the first embodiment.

A chamber 10 shown in FIG. 11 is a chamber 10 in which a mask 1 for deposition is aligned with a substrate 4 to be deposited. A deposition process is performed in a separate chamber 11 (see FIG. 17). The deposition process performed in this embodiment is to eject deposition material upward from a source of deposition 12 (see FIG. 17) and form the ejected deposition material in the form of a film in a predetermined pattern on the substrate 4 above the source of deposition 12 (see FIG. 17).

The mask 1 includes a base substrate 2 having openings 20 and a monocrystalline silicon substrate 3 bonded to the base substrate 2 and having opening patterns 30 corresponding to film forming patterns. The monocrystalline silicon substrate 3 is precisely positioned such that the opening patterns 30 are accommodated in the openings 20 of the base substrate 2. The base substrate 2 is made of glass, and non-opening portions (beam portions) 21 of the base substrate 2 are formed with holes in which pieces of iron 23 (a permanent magnet or a ferromagnetic substance) are embedded.

The mask 1 is loaded on a lower plate 9 movable in the X-Y-θ directions. The lower plate 9 is a non-magnetic surface plate (a surface contacting with the mask 1) having a flatness in the range of 10 μm to 100 μm (for example, 30 μm).

In addition, the substrate 4 is held by a chuck 50 installed at a side opposite to a surface of the substrate 4 on which deposition substance is deposited (i.e., a back side of the substrate 4). The chuck 50 used in this embodiment has a mechanism for chucking the substrate 4 using vacuum absorption force. Substrate conveyance and alignment operations in the chamber 10 are performed in a nitrogen atmosphere. In addition, a surface of the chuck 50 contacting with the substrate 4 is subject to a polishing treatment so as to become flat having a flatness in the range of 10 μm to 100 μm (for example, 30 μm).

In addition, at a back side of the chuck 50 is arranged a magnetic plate 7 on which permanent magnets 6 are attached. A magnetic force (absorption force) produced between the permanent magnets 6 and the pieces of iron 23 contained in the base substrate 2 of the mask 1 can be controlled by sliding the magnetic plate 7 vertically. In addition, at least two CCD cameras 8 are installed above the chamber 10. A process of aligning the mask 1 with the substrate 4 can be performed using the CCD cameras 8 through inspection windows 81 formed in the chamber 10.

Next, a sequence of deposition according to this embodiment will be described.

Figure 12:
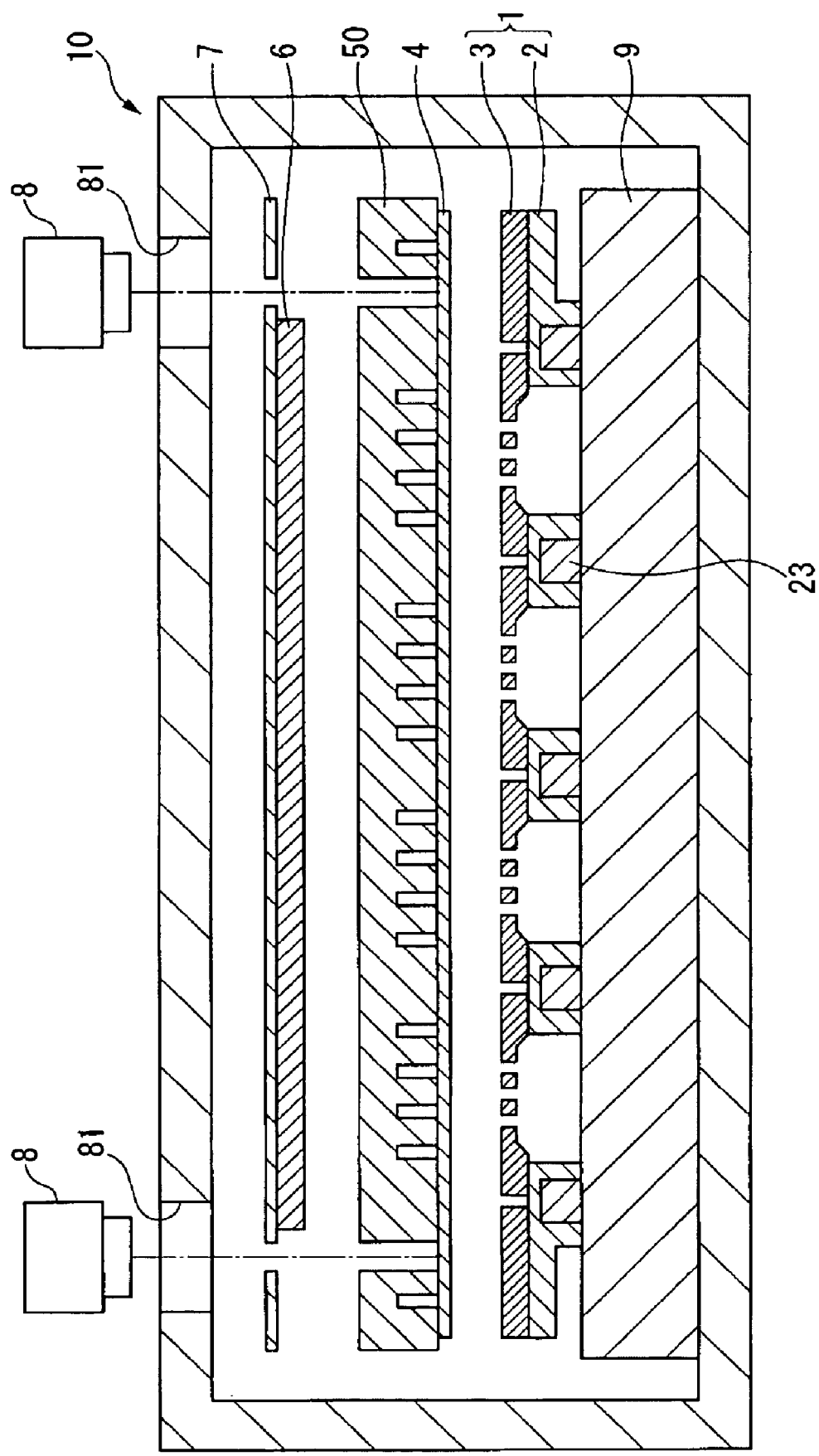
FIG. 12 is a schematic diagram illustrating one process of the deposition method according to another embodiment.

First, the substrate 4 is absorbed and held by the chuck 50 in the chamber 10, as shown in FIG. 12. With such absorption and holding maintained, the chuck 50 is lowered down to a position at which both an alignment mark (not shown) inscribed on the mask 1 and an alignment mark (not shown) inscribed on the substrate 4 are apparently seen at a time by the CCD cameras 8 installed above the chamber 10.

Figure 13:
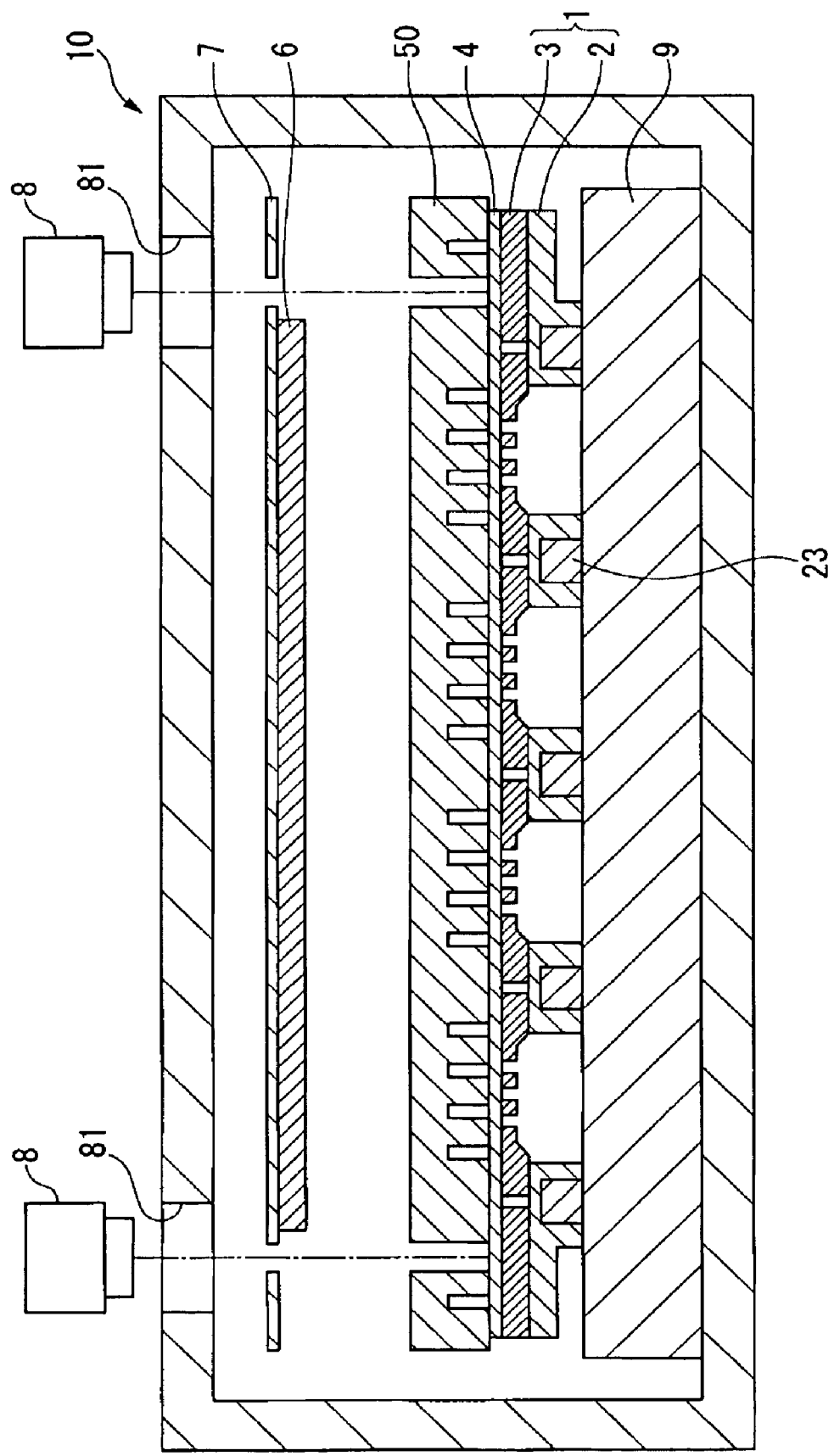
FIG. 13 is a schematic diagram illustrating one process of the deposition method according to another embodiment, subsequent to the process of FIG. 12.
Figure 14:
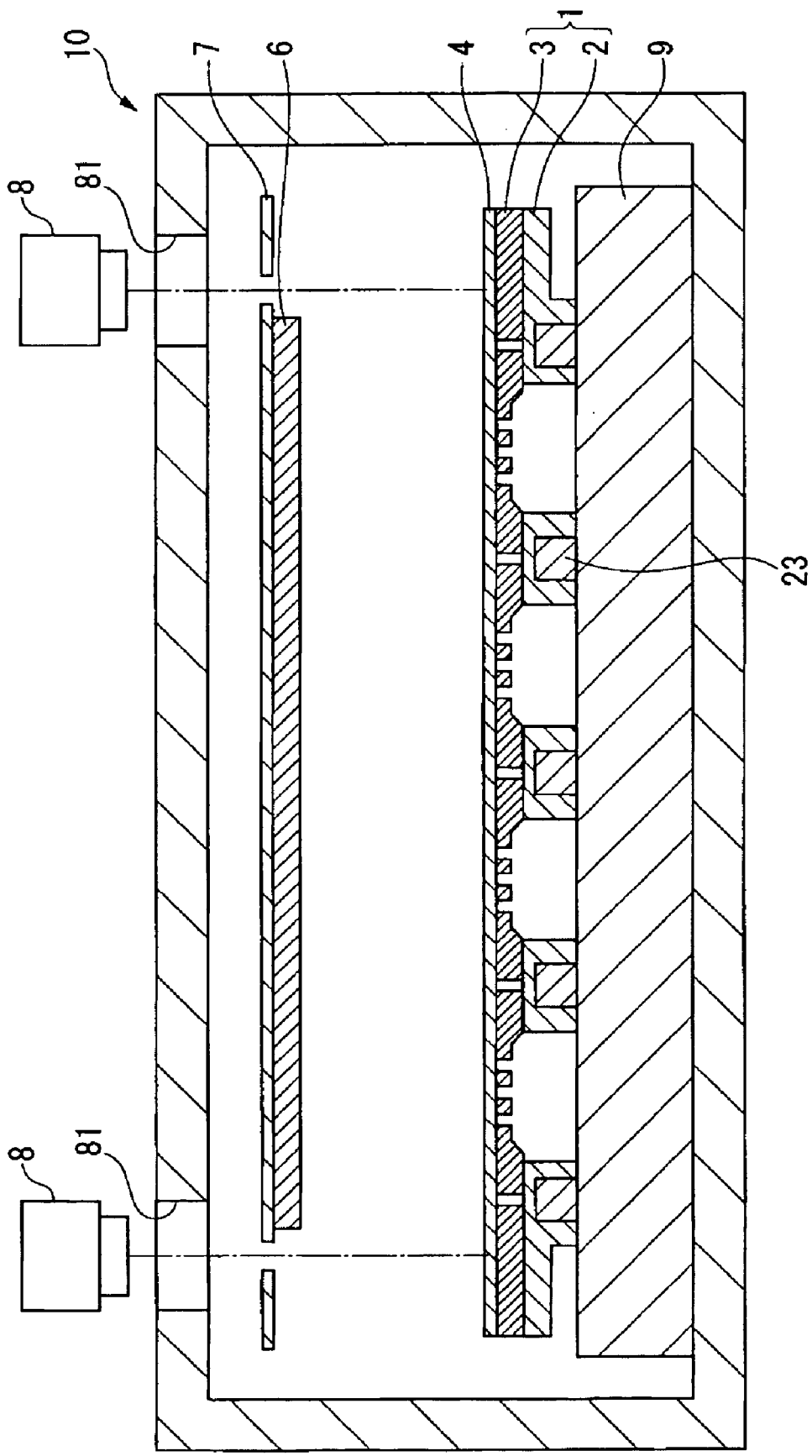
FIG. 14 is a schematic diagram illustrating one process of the deposition method according to another embodiment, subsequent to the process of FIG. 13.

With the chuck 50 lowered, after the position of the lower plate 9 is properly adjusted in the X-Y-θ directions so as to align the substrate 4 with the mask 1, the substrate 4 is reliably closely adhered to the mask 1, as shown in FIG. 13. Then, four corners of each of the substrate 4, the chuck 50 and the mask 1 are clamped so as to fix these members, the vacuum chuck 50 is released, and the released chuck 50 is moved out of the chamber 10 (FIG. 14)

Figure 15:
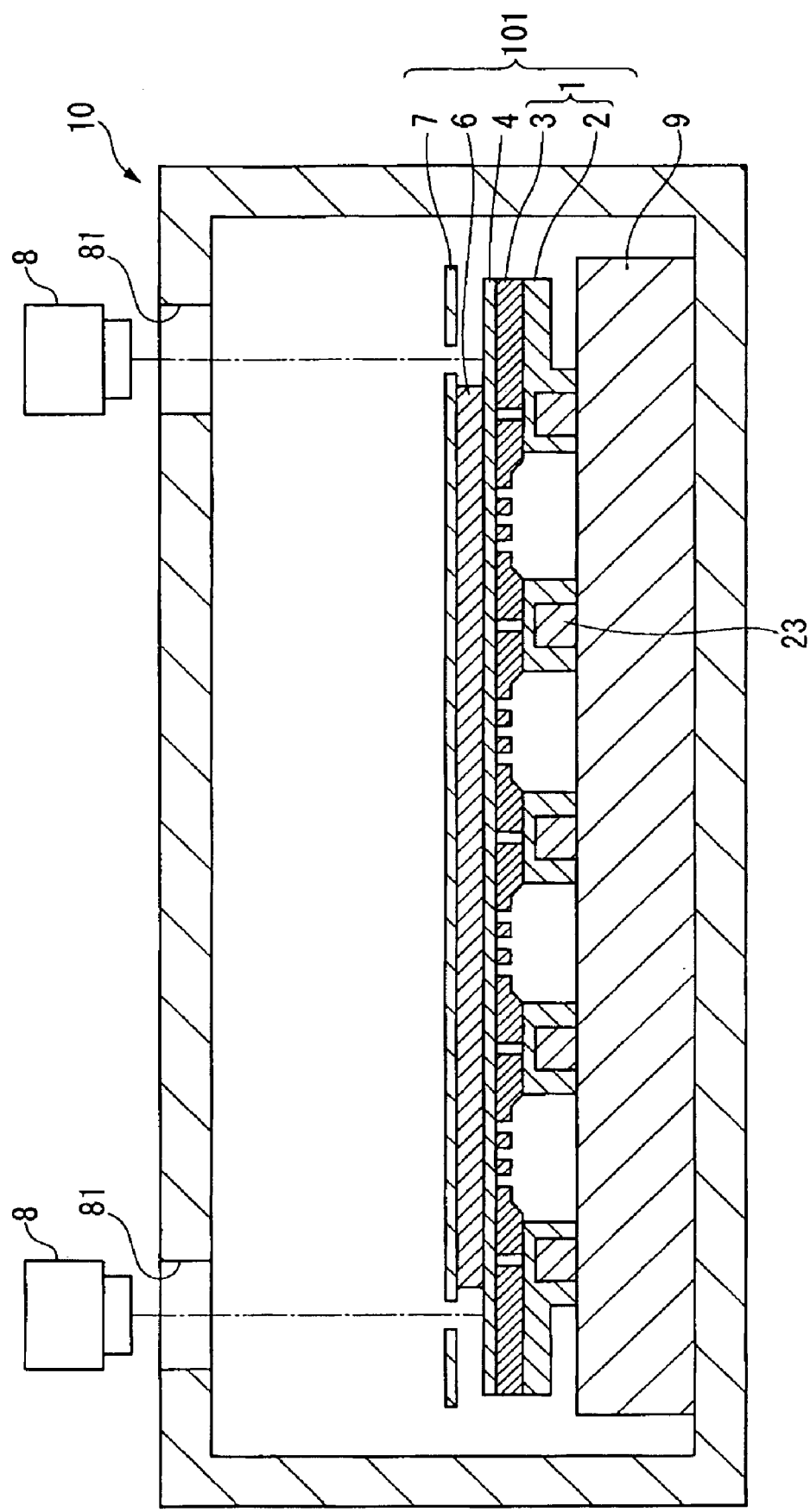
FIG. 15 is a schematic diagram illustrating one process of the deposition method according to another embodiment, subsequent to the process of FIG. 14.

Thereafter, the chamber 10 is decompressed to a vacuum state, and the magnetic plate 7 on which the permanent magnets 6 are attached is lowered, as shown in FIG. 15. In addition, surfaces of the permanent magnets 6 contacting with the substrate 4 are subject to a polishing treatment so as to become flat having a flatness in the range of 10 μm to 100 μm (for example, 30 μm).

Figure 16:
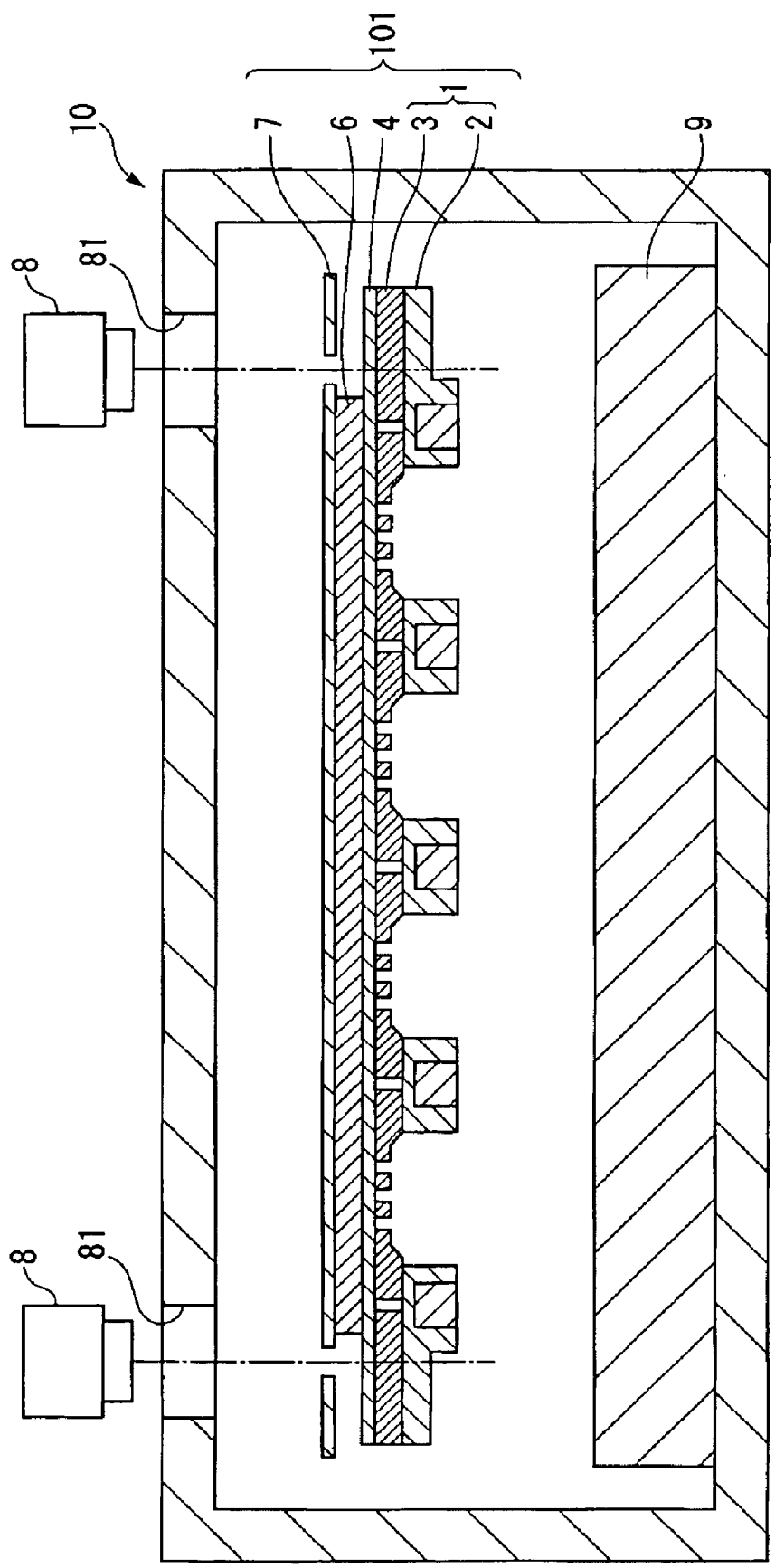
FIG. 16 is a schematic diagram illustrating one process of the deposition method according to another embodiment, subsequent to the process of FIG. 15.
Figure 17:
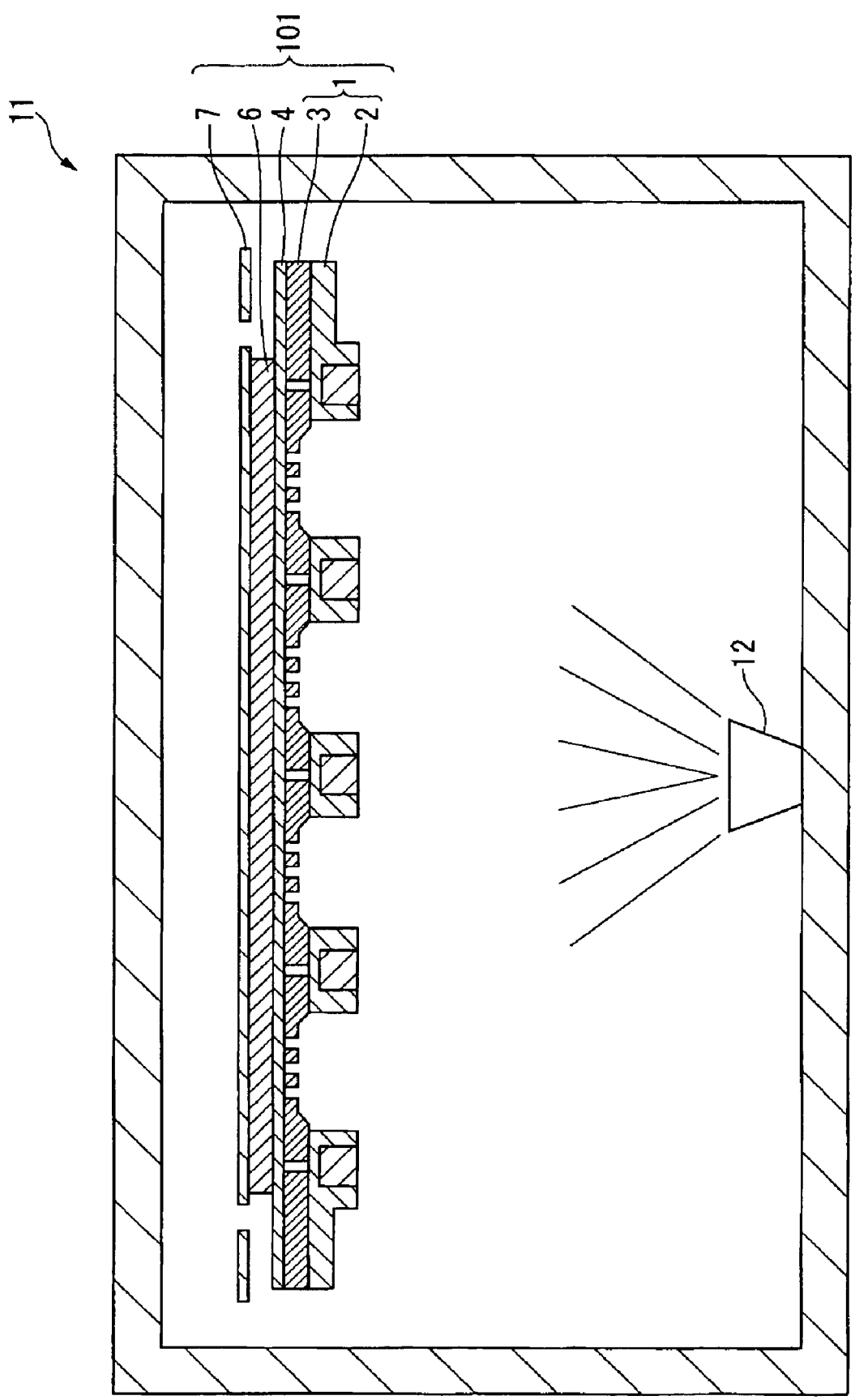
FIG. 17 is a schematic diagram illustrating one process of the deposition method according to another embodiment, subsequent to the process of FIG. 16.

Next, a unit 101 composed of the mask 1, the substrate 4, and the magnetic plate 7, which are integrally formed, is separated from the lower plate 9, as shown in FIG. 16, and carried into a deposition chamber 11 as shown in FIG. 17.

A deposition process is performed in the deposition chamber 11, with the unit 101 arranged above the source of deposition 12. Since the mask 1 is adhered to the chuck 50 by the magnetic force, it will not be bent due to its own weight and is reliably closely adhered to the substrate 4 in a flat state. Accordingly, very high density mask deposition can be attained. In addition, the substrate 4 also will not also be bent since the magnetic plate 7 functions as a surface plate, and it is possible to attain precise deposition even when the substrate 4 has a large size of 1 m×1 m or so.

In addition, the above-described deposition process may be employed in a downward deposition method. The downward deposition method, which is also called OVPD (organic vapor phase deposition), is a method of heating material over the boiling point into vapor, carrying the vapor by using inert gases, and depositing a film forming material on a substrate by ejecting the vapor on the substrate.

Figure 18:
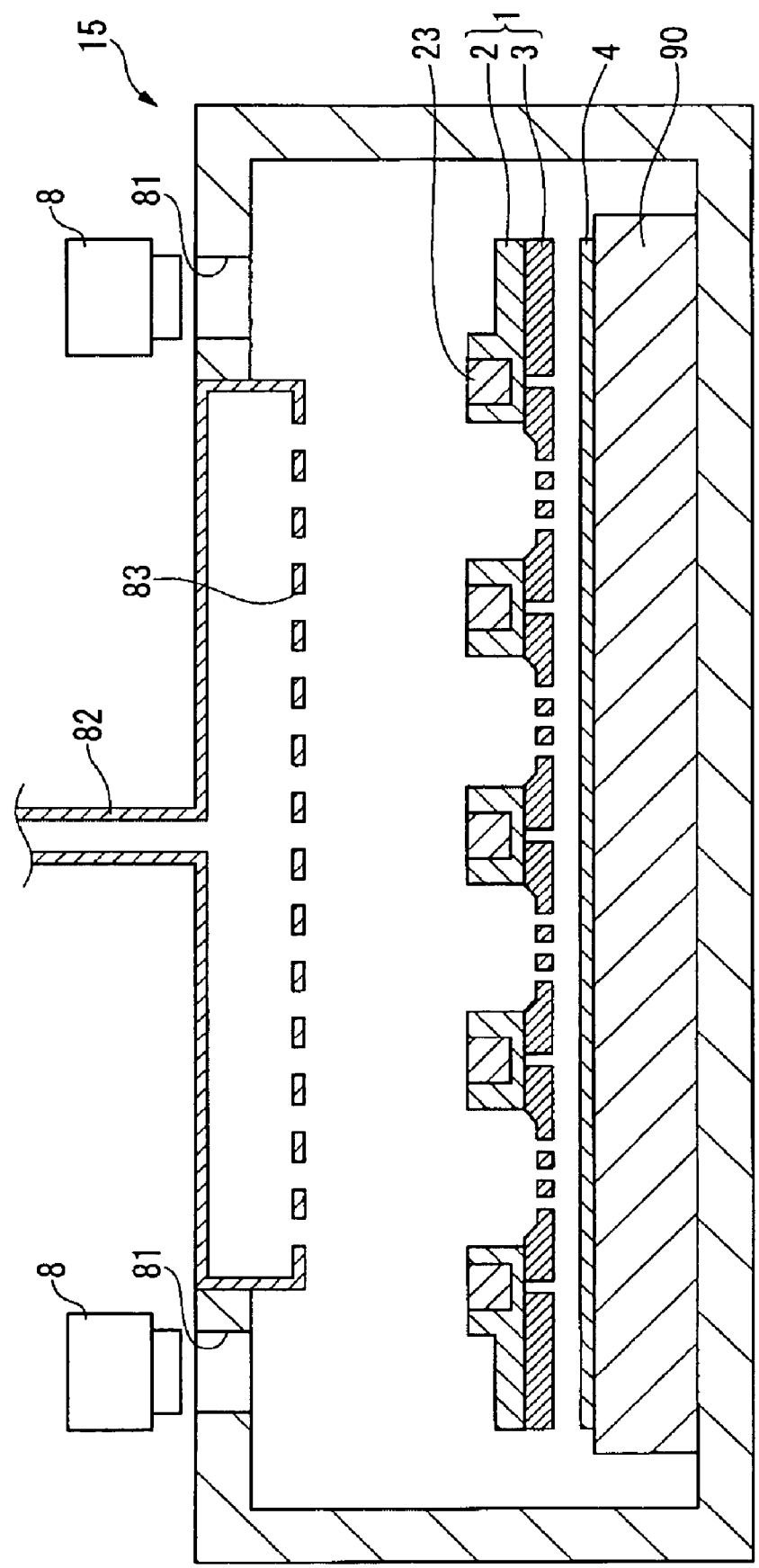
FIG. 18 is a schematic diagram illustrating configuration of a chamber used in a downward deposition method.

The downward deposition method is especially noted as a deposition method of a large-sized substrate since this method allows one chamber to perform deposition of several elements and has no need to suspend the substrate in the air, thereby making it difficult for the substrate to be bent. In an example shown in FIG. 18, a deposition material is introduced from a shower head 82 having an opening 83 and is deposited on the substrate 4 by the mask 1 arranged below the shower head 82. In addition, in this example, as a lower plate 90 provided with an electromagnet is adhered to the mask 1, the deposition process can be performed under a state where the mask 1 is closely adhered to the substrate 4 without being bent.

What is claimed is:

1. A method of forming a mask in which a film pattern is formed on a substrate by using a mask, comprising:
   supporting a first member having a flat surface within a deposition chamber including a supply source of film forming material;
   sequentially arranging the mask, the substrate, the first member and a magnet in this order from the supply source of film forming material;
   arranging the substrate on the first member such that the flat surface of the first member directly contacts with a first area of the substrate directly opposite a second area of the substrate where a film is to be formed; and
   supporting the substrate on the flat surface of the first member by attracting the mask and the first member in the first area by means of a magnetic force generated by the magnet.

2. The method of forming a mask according to claim 1, wherein the mask includes a base substrate having openings and a monocrystalline silicon substrate formed on the base substrate and having opening patterns, the base substrate is aligned with the monocrystalline silicon substrate such that the opening patterns are accommodated in the openings when viewed from the top of the openings, and non-opening portions of the base substrate are provided with a permanent magnet or a ferromagnetic substance.

3. The method of forming a mask according to claim 1, wherein the supply source is arranged below the substrate to form a film, and
   the mask is placed on a second member, the mask is closely adhered to the substrate after aligning the substrate on the mask with a predetermined gap therebetween, and then the film forming material is supplied from the supply source under a condition where the mask, the substrate, the first member and the magnet are integrally formed.

4. The method of forming a mask according to claim 1, wherein the supply source is arranged above the substrate on which a film is formed and the magnet is an electromagnet included in the first member, and
   wherein the method further includes:
   aligning the mask on the substrate with a predetermined gap therebetween;
   closely adhering the mask to the substrate;
   attracting the mask by actuating the electromagnet included in the first member; and
   supplying the film forming material from the supply source under a condition where the mask, the substrate and the first member are integrally formed.

5. The method of forming a mask according to claim 3, wherein the alignment of the substrate with the mask is performed while the substrate is held by using an electrostatic force or a vacuum.

6. The method of forming a mask according to claim 1, wherein the magnet is a permanent magnet attached to a plate arranged on a back surface of the first member opposite the flat surface of the first member, and
   wherein the mask is attracted toward the first member by lowering the plate on the back surface of the first member.

7. The method of forming a mask according to claim 6, wherein the permanent magnet is lowered within a recess formed in the back surface of the first member.

8. The method of forming a mask according to claim 6, wherein the supply source is arranged below the substrate to form a film, and the first magnet is lowered within a recess formed in the back surface of the first member.

9. A method of forming a mask in which a film pattern is formed on a substrate by using a mask, comprising:
   supporting a first member within a deposition chamber including a supply source of film forming material, the first member having a flat surface and a back surface opposite the flat surface;
   sequentially arranging the mask, the substrate, the first member and a plate including a first magnet in this order from a supply source of film forming material;
   holding the substrate in direct contact with the flat surface of the first member using an electrostatic force or a vacuum; and
   supporting the substrate on the flat surface of the first member after holding the substrate in direct contact with the flat surface by attracting the mask and the first member by means of a magnetic force generated by the first magnet,
   wherein the mask is provided with a second magnet or a ferromagnetic substance and the mask is attracted toward the first member by moving the plate including the first magnet toward the mask.

* * * * *